(12) United States Patent
Son et al.

(10) Patent No.: US 8,586,979 B2
(45) Date of Patent: Nov. 19, 2013

(54) OXIDE SEMICONDUCTOR TRANSISTOR AND METHOD OF MANUFACTURING THE SAME

(75) Inventors: Kyoung-Seok Son, Yongin-si (KR);
Tae-Sang Kim, Yongin-si (KR);
Jang-Yeon Kwon, Yongin-si (KR);
Ji-Sim Jung, Yongin-si (KR);
Sang-Yoon Lee, Yongin-si (KR);
Myung-Kwan Ryu, Yongin-si (KR);
Kyung-Bae Park, Yongin-si (KR);
Byung-Wook Yoo, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 408 days.

(21) Appl. No.: 12/320,701

(22) Filed: Feb. 2, 2009

(65) Prior Publication Data

US 2009/0206332 A1     Aug. 20, 2009

Related U.S. Application Data

(63) Continuation-in-part of application No. 12/078,735, filed on Apr. 3, 2008, now abandoned.

(30) Foreign Application Priority Data

Feb. 1, 2008   (KR) .................. 10-2008-0010816
Oct. 10, 2008  (KR) .................. 10-2008-0099608

(51) Int. Cl.
*H01L 29/10*   (2006.01)
*H01L 29/12*   (2006.01)

(52) U.S. Cl.
USPC ............... 257/43; 257/369; 257/E29.296

(58) Field of Classification Search
USPC ................ 438/151; 257/369, 43, E29.296
See application file for complete search history.

(56) References Cited

U.S. PATENT DOCUMENTS

| 5,140,391 | A | * | 8/1992 | Hayashi et al. | ............... 257/365 |
| 7,242,039 | B2 | * | 7/2007 | Hoffman et al. | ............... 257/213 |
| 2001/0030323 | A1 | * | 10/2001 | Ikeda | ............... 257/59 |

(Continued)

FOREIGN PATENT DOCUMENTS

JP   2007-073705   3/2007
WO   WO 2006/060521   6/2006

OTHER PUBLICATIONS

Office Action and Search Report dated Jun. 3, 2009 for corresponding European Application No. 09151196.4-1528.

(Continued)

*Primary Examiner* — Angel Roman
(74) *Attorney, Agent, or Firm* — Harness, Dickey & Pierce, P.L.C.

(57) ABSTRACT

An oxide semiconductor thin film transistor (TFT) and a method of manufacturing the oxide semiconductor TFT. The oxide semiconductor TFT includes a first gate insulating layer arranged between an oxide semiconductor channel layer and a first gate and a second gate insulating layer arranged between the channel layer and a second gate. The first and second gate insulating layers are made out of different materials and have different thicknesses. Preferably, the second gate insulating layer is silicon oxide and is thinner than the first gate insulating layer which is preferably silicon nitride. Oxide semiconductor refers to an oxide material such as Zinc Oxide, Tin Oxide, Ga—In—Zn Oxide, In—Zn Oxide, In—Sn Oxide, and one of Zinc Oxide, Tin Oxide, Ga—In—Zn Oxide, In—Zn Oxide and In—Sn Oxide.

29 Claims, 11 Drawing Sheets

(56) References Cited

U.S. PATENT DOCUMENTS

| | | |
|---|---|---|
| 2002/0139978 A1 | 10/2002 | Yamazaki et al. |
| 2002/0179908 A1 | 12/2002 | Arao |
| 2003/0038288 A1* | 2/2003 | Suzuki et al. ............. 257/72 |
| 2005/0199879 A1* | 9/2005 | Hoffman et al. ............ 257/72 |
| 2005/0199960 A1 | 9/2005 | Hoffman et al. |
| 2006/0097319 A1* | 5/2006 | Kim et al. ................. 257/353 |
| 2006/0118869 A1* | 6/2006 | Lan et al. ................. 257/347 |
| 2006/0166415 A1 | 7/2006 | Afentakis et al. |
| 2006/0189049 A1 | 8/2006 | Afentakis et al. |
| 2008/0038882 A1* | 2/2008 | Takechi et al. ............ 438/151 |
| 2008/0054257 A1 | 3/2008 | Tsai et al. |
| 2008/0111195 A1* | 5/2008 | Atanackovic ............... 257/366 |
| 2011/0267297 A1* | 11/2011 | Yamazaki et al. .......... 345/173 |

OTHER PUBLICATIONS

Kenjo Nomura et al., "room-temperature fabrication of transparent flexible thin-film transistors using amorphous oxide semiconductors", *Nature*, vol. 432, No. 25, pp. 488-492 (Nov. 2004).

Tamar Cakici et al., "A Low Power Four Transistor Schmitt Trigger for Asymmetric Double Gate Fully Depleted SOI Devices", *IEEE Int'l SOI Conf.*, New York, NY, 2003 Conf. Proc. Newport Beach, CA (Sep. 9-Oct. 2, 2003) pp. 21-22.

\* cited by examiner

OXIDE SEMICONDUCTOR TRANSISTOR AND METHOD OF MANUFACTURING THE SAME

CLAIM OF PRIORITY

This application is a continuation-in-part of U.S. patent application Ser. No. 12/078,735, filed on Apr. 3, 2008, now abandoned, which claim the benefit of Korean Patent Application No. 10-2008-0010816, filed on Feb. 1, 2008, in the Korean Intellectual Property Office, the disclosures of which are incorporated herein in their entirety by reference. This application also claims the benefit of Korean Patent Application No. 10-2008-0099608, filed on Oct. 10, 2008, in the Korean Intellectual Property Office, the disclosure of which is incorporated herein in its entirety by reference.

BACKGROUND OF THE INVENTION

1. Field of the Invention

An oxide semiconductor thin film transistor (TFT) and a method of manufacturing the same where the channel layer includes an oxide semiconductor material.

2. Description of the Related Art

TFTs have been applied in various fields. In particular, TFTs are used as switching and driving devices in display devices and as selection switches in cross point type memory devices.

Liquid crystal displays (LCDs) are mainly used as television (TV) panels. Therefore, much research has been conducted in order to apply organic light emitting display (OLED) technology to TVs. TV display technology has been developed to satisfy the requirements of the display market, such as large-scale TVs or Digital Information Displays (DIDs), low prices, high definition (moving picture expression, high resolution, brightness, contrast ratio, color representation, etc.), etc. In order to cope with these requirements, large-sized substrates such as glass, etc., are required as well as high performance TFTs for use as switching and driving devices.

Amorphous silicon (a-Si) TFTs are widely used in to produce low cost driving and switching devices that can be implemented uniformly across large displays having lengths of 2 meters. However, such a-Si TFTs are required to have a high performance in view of the tendency to produce high definition characteristics in a large-sized display device. However, a-Si TFTs technology is limited in that the mobility can not exceed 0.5 $cm^2/Vs$. Accordingly, high-performance TFTs having higher mobility than a-Si TFTs and manufacturing techniques for such TFTs are required.

Since poly silicon (p-Si) TFTs have high mobility of several tens to hundreds of $cm^2/Vs$, the p-Si TFTs, unlike the a-Si TFTs, are applied to high definition displays. Also, the characteristics of p-Si TFTs deteriorate much less than do the characteristics a-Si TFTs. However, more complicated processes are required to manufacture p-Si TFTs than a-Si TFTs, which increases the manufacturing costs. Therefore, p-Si TFTs are appropriate for high definition displays and products such as OLEDs. However, p-Si TFTs are inferior to a-Si TFTs in terms of cost and thus have limited applications in displays. Also, in the case of p-Si TFTs, manufacturing processes using large substrates having lengths of 1 meter or more have not been introduced due to limits in manufacturing equipment and technical problems such as poor uniformity. Thus, it is difficult to apply p-Si TFTs to TV products.

Therefore, what is needed is a new TFT technology that can combine together the advantages of a-Si TFTs and p-Si TFTs so that a large screen, high definition TV display can be produced at reduced manufacturing costs.

Recently, ZnO-based TFTs have been in the spotlight as an oxide semiconductor device. Zn Oxide, Ga—In—Zn Oxide, etc., have been introduced as ZnO-based materials. Since ZnO-based semiconductor devices are manufactured using low temperature processes that have amorphous phases, ZnO-based semiconductor devices can be easily formed over large areas. Like p-Si, ZnO-based semiconductor films have superior electrical characteristics such as high mobility. As a result, research has been conducted to try to use oxide semiconductor material layers having high mobility, such as ZnO-based material layers, into channel areas of TFTs. Zn Oxide, Ga—In—Zn Oxide, etc., are introduced as ZnO-based materials.

SUMMARY OF THE INVENTION

One or more embodiments include a transistor including an oxide semiconductor as a channel material and a method of manufacturing the same.

Additional aspects will be set forth in part in the description which follows and, in part, will be apparent from the description, or can be learned by practice of the invention.

According to one aspect of the present invention, there is provided an oxide semiconductor thin film transistor (TFT) that includes a channel layer including an oxide semiconductor, a first gate, a second gate, a first gate insulating layer arranged between the channel layer and the first gate and a second gate insulating layer arranged between the channel layer and the second gate, wherein the first and second gate insulating layers are made out of different materials.

The first gate insulating layer can include a material that is absent of oxygen, and the second gate insulating layer can include a material that includes oxygen. The first gate insulating layer can include silicon nitride, and the second gate insulating layer can include silicon oxide. The first and second gate insulating layers can have different thicknesses. The first gate insulating layer can be thicker than the second gate insulating layer. A thickness of the first gate insulating layer can be in the range of 2000 Å to 1 μm, and a thickness of the second gate insulating layer can be in the range of 500 Å to 5000 Å.

The oxide semiconductor TFT can also include source and drain electrodes arranged at opposite sides of an upper surface of the channel layer. Alternatively, the oxide semiconductor TFT can also include source and drain electrodes arranged at opposite sides of a lower surface of the channel layer. The second gate can be electrically connected to the first gate. The second gate can instead be electrically connected to an independent line that electrically insulated from the first gate. The oxide semiconductor can be one of Zinc Oxide, Tin Oxide, Ga—In—Zn Oxide, In—Zn Oxide, In—Sn Oxide, and one of Zinc Oxide, Tin Oxide, Ga—In—Zn Oxide, In—Zn Oxide, and In—Sn Oxide that are doped with one of Al, Ni, Cu, Ta, Mo, Hf, and Ti.

According to another aspect of the present invention, there is provided an oxide semiconductor TFT that includes a channel layer including an oxide semiconductor, a first gate, a second gate, a first gate insulating layer arranged between the channel layer and the first gate and a second gate insulating layer arranged between the channel layer and the second gate, wherein the first and second gate insulating layers have different thicknesses.

The first gate insulating layer can be thicker than the second gate insulating layer. A thickness of the first gate insulating layer can be in the range of 2000 Å to 1 μm, and a thickness of the second gate insulating layer can be in the range of 500 Å to 5000 Å. The first and second gate insulating layers can include different materials. The first gate insulating layer can include material that is absent of oxygen, and the second gate insulating layer can include oxygen. The first gate insulating layer can include silicon nitride, and the second gate insulating layer can include silicon oxide.

The oxide semiconductor TFT can also include source and drain electrodes arranged at opposite sides of an upper surface of the channel layer. Alternatively, the oxide semiconductor can also include source and drain electrodes arranged at opposite sides of a lower surface of the channel layer. The second gate can be electrically connected to the first gate. Alternatively, the second gate can be electrically connected to an independent line that is electrically insulated from the first gate. The oxide semiconductor can be one of Zinc Oxide, Tin Oxide, Ga—In—Zn Oxide, In—Zn Oxide, In—Sn Oxide, and one of Zinc Oxide, Tin Oxide, Ga—In—Zn Oxide, In—Zn Oxide, and In—Sn Oxide that are doped with one of Al, Ni, Cu, Ta, Mo, Hf, and Ti.

According to yet another aspect of the present invention, there is provided a method of manufacturing an oxide semiconductor TFT, including forming sequentially a first gate and a first gate insulating layer on a substrate, forming a channel layer having of an oxide semiconductor on the first gate insulating layer, forming a second gate insulating layer that covers the channel layer and forming a second gate on the second gate insulating layer.

The first and second gate insulating layers can include different materials. The first gate insulating layer can include a material that is absent of any oxygen, and the second gate insulating layer can include a material that includes oxygen. The first gate insulating layer can include silicon nitride, and the second gate insulating layer can include silicon oxide. The first and second gate insulating layers can have different thicknesses. The first gate insulating layer can be thicker than the second gate insulating layer. The first gate insulating layer can have a thickness in the range of 2000 Å to 1 μm, and the second gate insulating layer can have a thickness in the range of 500 Å to 5000 Å.

The method can also include forming source and drain electrodes at opposite sides of an upper surface of the channel layer after the formation of the channel layer. Alternately, the method can also include forming source and drain electrodes on the first gate insulating layer before the formation of the channel layer. The method can include supplying oxygen into an upper portion of the channel layer by performing a plasma process using oxygen ions. The second gate can be electrically connected to the first gate. The second gate can be electrically connected to an independent line that is electrically insulated from the first gate. The oxide semiconductor can be one of Zinc Oxide, Tin Oxide, Ga—In—Zn Oxide, In—Zn Oxide, In—Sn Oxide, and one of Zinc Oxide, Tin Oxide, Ga—In—Zn Oxide, In—Zn Oxide and In—Sn Oxide that are doped with one of Al, Ni, Cu, Ta, Mo, Hf, and Ti.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
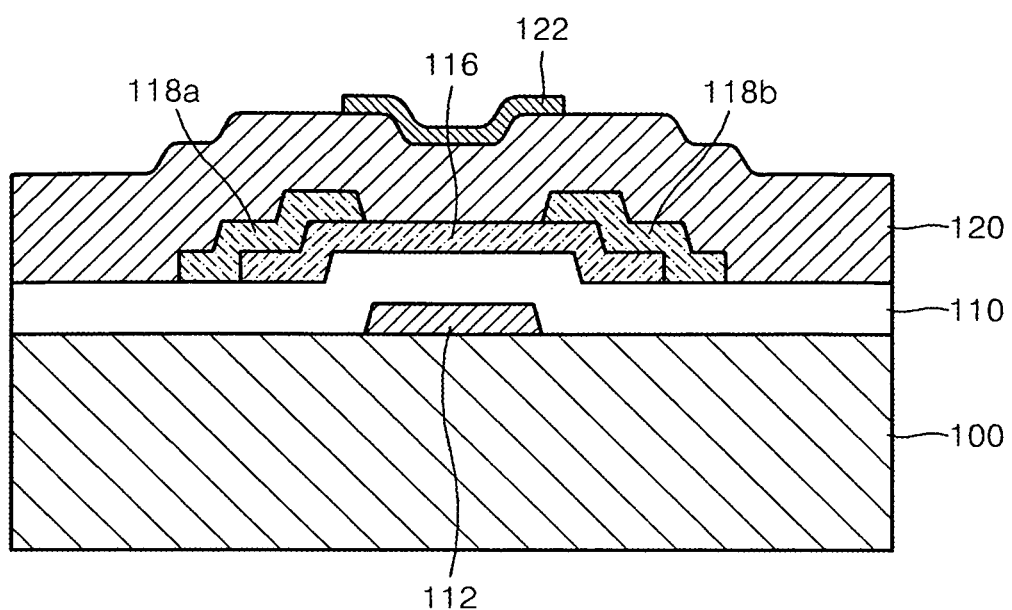
FIG. 1 is a cross-sectional view of an oxide semiconductor thin film transistor (TFT) according to one embodiment of the present invention.

One or more embodiments provide a thin film transistor (TFT) including an oxide semiconductor channel layer. Such an oxide semiconductor TFT according to the embodiments of the present invention can be applied to a driving circuit unit and a pixel unit of a display device such as a liquid crystal display (LCD), an organic light emitting device (OLED), or the like. The oxide semiconductor TFT can instead be applied to just one of the driving circuit unit and the pixel unit.

Hereinafter, the embodiments will be described in detail with reference to the attached drawings. Like reference numerals in the drawings denote like elements. In the drawings, the sizes or thicknesses of elements are exaggerated for clarity.

Turning now to FIG. 1, FIG. 1 is a cross-sectional view of an oxide semiconductor TFT according to an embodiment of the present invention. Referring to FIG. 1, the oxide semiconductor TFT of the present embodiment includes a channel layer 116, a first gate insulating layer 110 and a first gate 112 that are sequentially formed on a lower surface of the channel layer 116, and a second gate insulating layer 120 and a second gate 122 that are sequentially formed on an other (or top) surface of the channel layer 116. Here, the first and second gate insulating layers 110 and 120 can be made out of different materials. The first and second gate insulating layers 110 and 120 can also be made to have different thicknesses.

The substrate 100 is a transparent glass substrate but can instead be a transparent plastic substrate. The first gate 112 is first formed on the substrate 100. Although not shown in FIG. 1, a gate line 211 of FIG. 6 can also be formed on the substrate 100 to electrically connect to the first gate 112 so as to apply a predetermined voltage to the first gate 112. A gate metal such as Mo or the like can be deposited on the substrate 100 and then patterned to form the first gate 112.

The first gate insulating layer 110 is formed on the substrate 100 to cover the first gate 112. In the present embodiment, the first gate insulating layer 110 can be made out of a different material from that of the second gate insulating layer 112, where the second gate insulating layer 120 will be described later. More specifically, the first gate insulating layer 110 can be made out of a material that does not include oxygen, such as silicon nitride. The first gate insulating layer 110 can also be made to have a different thickness from that of the second gate insulating layer 120. More specifically, a thickness $d_1$ of the first gate insulating layer 110 can be thicker than a thickness $d_2$ of the second gate insulating layer 120. For example, the thickness $d_1$ of the first gate insulating layer 110 can be within a range of 2000 Å to 1 μm, but the present invention is not limited thereto.

The channel layer 116 is made out of an oxide semiconductor to a predetermined thickness on the first gate insulating layer 110. The channel layer 116 is located above the first gate 112. The oxide semiconductor can be Zinc Oxide, Tin Oxide, Ga—In—Zn Oxide, In—Zn Oxide, In—Sn Oxide, or one of Zinc Oxide. Tin Oxide, Ga—In—Zn Oxide, In—Zn Oxide, and In—Sn Oxide that is doped with Al, Ni, Cu, Ta, Mo, Hf, or Ti. The channel layer 116 can be formed to a thickness between 10 nm and 300 nm, but the present invention is not limited thereto. To form the channel layer 116, an oxide semiconductor can be deposited to a predetermined thickness on the first gate insulating layer 110 and then patterned to form the channel layer 116.

Source and drain electrodes 118a and 118b are respectively formed at opposite sides (or ends) of an upper surface of the oxide semiconductor channel layer 116. To produce the source and drain electrodes 118a and 118b, a predetermined metal layer is formed on the gate insulating layer 110 to cover the channel layer 116. This metal layer can then be patterned in order to form the source and drain electrodes 118a and 118b. Here, the predetermined metal layer can have a single layer structure or a multilayer structure. The predetermined metal layer can also be made out of at least one of Cu Mo, and Al. Alternatively, the source and drain electrodes 118a and 118b can instead be formed on opposite sides of a lower surface of the channel layer 116. The source electrode 118a can be electrically connected to a data line 219 as in FIG. 6.

The second gate insulating layer 120 is formed to a predetermined thickness on the first gate insulating layer 110 to cover the channel layer 116 and the source and drain electrodes 118a and 118b. In the present embodiment, as previously described, the second gate insulating layer 120 can be made out of a different material than that of the first gate insulating layer 110. More specifically, the second gate insulating layer 120 can be made out of a material that includes oxygen, such as silicon oxide. The second gate insulating layer 120 can have a different thickness than that of the first gate insulating layer 110. Specifically, the thickness $d_2$ of the second gate insulating layer 120 can be thinner than the thickness $d_1$ of the first gate insulating layer 110. For example, the thickness $d_2$ of the second gate insulating layer 120 can be between 500 Å and 5000 Å, but the present invention is not limited thereto.

The second gate 122 is formed on the second gate insulating layer 120. The second gate 122 is arranged at a location that corresponds to the channel layer 116. The second gate 122 can be made out of the same material (e.g., Mo or the like) as that of the first gate 112. As will be described later, the second gate 122 can be made out of the same material (e.g., a transparent conductive material such as Indium Tin Oxide (ITO) or Indium Zinc Oxide (IZO)) as that of which a pixel electrode 250 of FIG. 7. The second gate 122 can have a line width from 0.08 μm to 100 μm, but the present invention is not limited thereto.

When a predetermined voltage is applied to the second gate 122, the second gate 122 reduces and essentially eliminates leakage current while increasing an operating current in a turn-on state of the oxide semiconductor TFT. The second gate 122 can be electrically connected to the first gate 112 so that the second gate 122 is electrically synchronized with the first gate 112. When the second gate 122 is electrically connected to and synchronized with the first gate 122, the second gate 122 can be electrically connected to the gate line 211 of FIG. 6 through a via hole 262 of FIG. 8 that is formed in both the second gate insulating layer 120 and the first gate insulating layer 110. Alternatively, the second gate 122 can be connected to an independent line (not shown) that is electrically insulated from the first gate 112. The independent line can be formed on the substrate 100 or on another material layer. When the second gate 122 is connected to an independent line that is electrically insulated from the first gate 112, a predetermined direct current (DC) voltage is applied to the second gate 122 through the independent line separate from the first gate 112.

In the oxide semiconductor TFT having the above-described structure, a predetermined voltage can be applied to the second gate 122 to prevent leakage current that can flow through an upper portion of the channel layer 116, resulting in an increase in the threshold voltage as compared to a conventional oxide semiconductor TFT. Also, when the oxide semiconductor TFT is turned on, current gains are obtained from both upper and lower portions of the channel layer 116. Thus, a sub-threshold slope or mobility is improved. Therefore, a higher operating current is obtained at the same driving voltage than in the conventional oxide semiconductor TFT.

Figure 2:
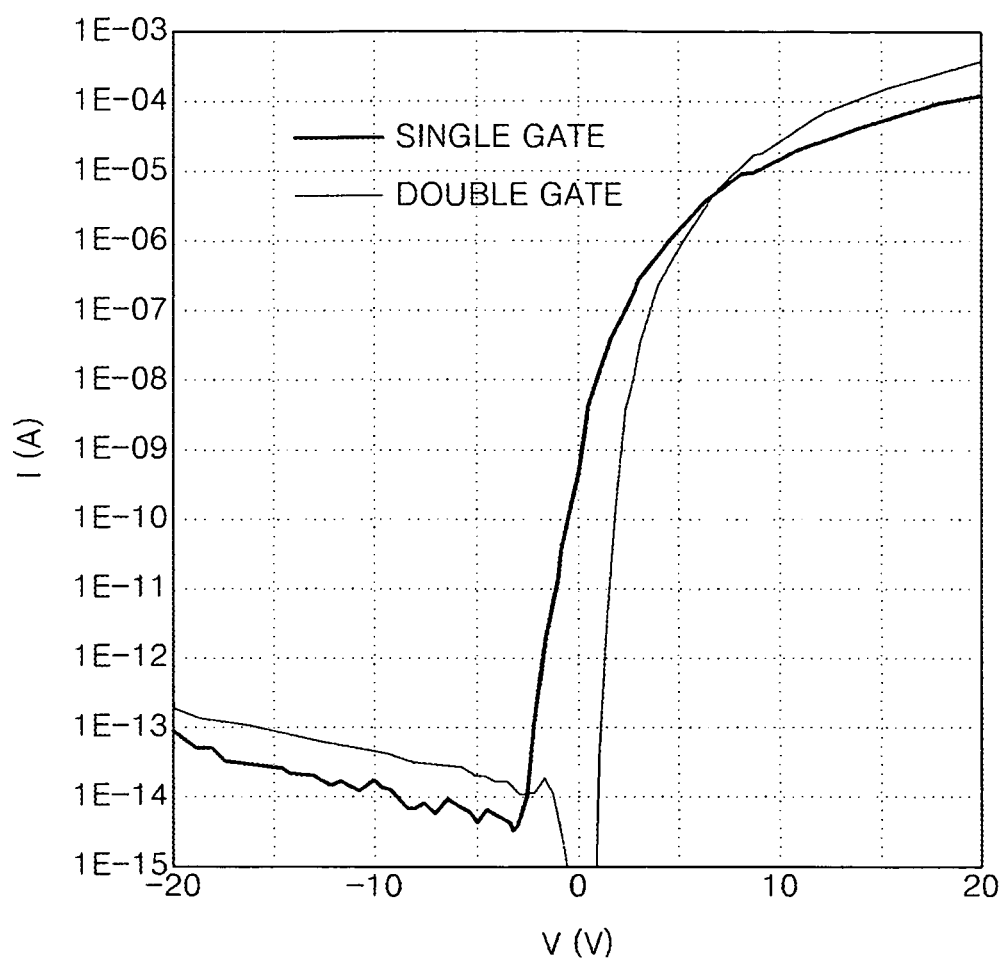
FIG. 2 shows a graph for comparing current-voltage (I-V) characteristics of a double gate structure oxide semiconductor TFT having first and second gates synchronized to each other with I-V characteristics of a single gate structure oxide semiconductor TFT.

Turning now to FIG. 2, FIG. 2 shows a graph for comparing I-V characteristics of an oxide semiconductor TFT having a double gate structure according to an embodiment of the present invention to I-V characteristics of an oxide semiconductor TFT having a single gate structure, according to an embodiment of the present invention. Here, the I-V characteristics of the oxide semiconductor TFT having the double gate structure are measured when the two gates are electrically synchronized with each other. Also, the channel layer includes Ga—In—Zn oxide as an oxide semiconductor, and first and second gate insulating layers are made out of silicon nitride and silicon oxide, respectively. The first and second gate insulating layers are also formed to thicknesses of 4000 Å and 2000 Å, respectively. A first gate electrode and source and drain electrodes are made out of Mo and are arranged on a lower surface of a channel layer, and a second gate is made out of In—Zn Oxide and is arranged on an upper surface of the channel layer.

Referring now to FIG. 2, a threshold voltage is increased by about 1.8V for the oxide semiconductor TFT having the double gate structure as compared to the oxide semiconductor TFT having the single gate structure. Also, a current at a gate voltage of 0V is greatly reduced from 1 nA to 1 fA. This is because a leakage current flowing through an upper portion of the channel layer is restrained by the second gate formed on the second gate insulating layer. Further, in the oxide semiconductor TFTs having the single gate structure and the double gate structure, mobility is about 9.1 cm$^2$/Vs and about 32.1 cm$^2$/Vs, respectively. Therefore, the mobility of the oxide semiconductor TFT having the double gate structure is increased by a factor of 3.5. The increase in mobility is attributed to the presence of the second gate arranged on the second gate insulating layer and the fact that the second gate insulating layer has a smaller thickness than the first gate insulating layer. Also, sub-threshold slopes of the oxide semiconductor TFTs having the single gate structure and the double gate structure are about 1.45 dec/V and about 1.85 dec/V, respectively. Therefore, the sub-threshold slope of the oxide semiconductor TFT having the double gate structure is increased by a factor of 1.27 as compared to the oxide semiconductor TFT having the single gate structure.

Figure 3:
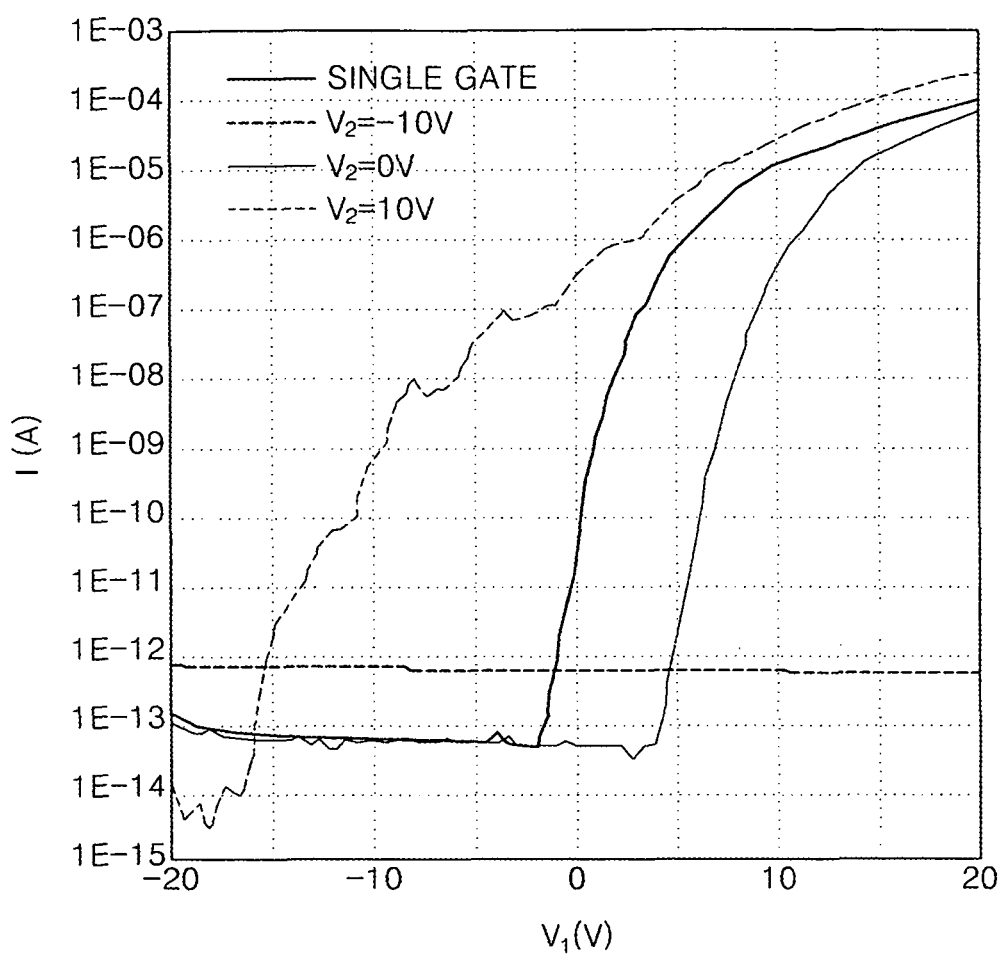
FIG. 3 illustrates a comparison of I-V characteristics of a double gate structure oxide semiconductor TFT having a second gate that is electrically insulated from the first gate with I-V characteristics of a single gate structure oxide semiconductor TFT.

Turning now to FIG. 3, FIG. 3 shows a graph comparing I-V characteristics of an oxide semiconductor TFT having a double gate structure to an oxide semiconductor TFT having a single gate structure, according to an embodiment of the present invention. Here, the I-V characteristics of the oxide semiconductor TFT having the double gate structure are measured when a second gate is connected to an independent line that is electrically insulated from the first gate. In FIG. 3, $V_1$ and $V_2$ respectively denote voltages applied to first and second gates. Here, Ga—In—Zn Oxide is used as an oxide semiconductor for the channel layer, and first and second gate insulating layers are made out of silicon nitride and silicon oxide, respectively. Thicknesses of the first and second gate insulating layers are 4000 Å and 2000 Å, respectively. The first gate, source and drain electrodes are made out of Mo and are arranged on a lower surface of the channel layer, the second gate being made out of In—Zn Oxide and being arranged an upper surface of the channel layer.

Referring to FIG. 3, when the voltage $V_2$ of the second gate is −10V, the oxide semiconductor TFT is turned off for voltages $V_1$ of the first gate between −20V and 20V. However, when the voltage $V_2$ of the second gate is +10V, the threshold voltage decreases and the operating current increases as compared to the threshold voltage and the operating current for the oxide semiconductor TFT having the single gate structure. Also, when the voltage $V_2$ of the second gate is 0V, the threshold voltage increases by about 7V as compared to the threshold voltage for the oxide semiconductor TFT having the single gate structure.

As described above, in an oxide semiconductor TFT according to an embodiment of the present invention, I-V characteristics vary more for a TFT having the second gate structure than they do for a TFT having the single gate structure. This is because an oxide semiconductor TFT according to an embodiment of the present invention has the following structure. A channel layer is made out of an oxide semiconductor and has a thickness of about 700 Å, and thus an electric field produced by voltages applied to the first and second gates influences both upper and lower portions of the channel layer. Also, the first gate insulating layer is a silicon nitride layer having a thickness of about 4000 Å, and the second gate insulating layer is a silicon oxide layer having a thickness of about 2000 Å. Thus, a capacitance of the second gate insulating layer is greater than a capacitance of the first gate insulating layer. As a result, it is observed that the presence of the second gate and the influence that the voltages applied to the second gate has on the I-V curves of the TFT are high. Therefore, a thickness and a dielectric constant of the second gate insulating layer can be adjusted to change the influence of the voltage applied to the second gate.

In more detail, when the capacitance of the second gate insulating layer becomes greater than the capacitance of the first gate insulating layer, the influence produced by the application of voltages to the second gate increases. Also, when a thickness of the channel layer becomes thinner and a line width of the second gate increases, the influence on I-V curves produced by the application of voltages applied to the second gate further increases. Accordingly, in the oxide semiconductor TFT having the double gate structure, at least one of the voltage applied to the second gate, the thickness of the channel layer, the thickness and dielectric constant of the second gate insulating layer, and the line width of the second gate can be varied to change the influence that the voltages applied to the second gate has on the I-V characteristics of the TFT. As a result, the threshold voltage can be controlled.

In the oxide semiconductor TFT having the double gate structure, a back channel area of oxide semiconductor is plasma-damaged during a source-drain electrode patterning process, a photoresist ashing process, and a second gate insulating layer depositing process. Thus, leakage current increases and a variation in the threshold voltage also increases during the application of a bias voltage due to an increase in trap sites caused by the plasma damage. Therefore, an electric field produced by voltages applied to the second gate is adjusted to minimize the leakage current and the charge trapping. A reduction in the leakage current and an improvement of reliability, which are to be achieved through the adjustment of the electric field produced by the presence of the second gate and voltages applied to the second gate, can be realized by reducing the thickness of the second gate insulating layer and applying the same voltage to the second gate as is applied to the first gate.

Figure 4A:
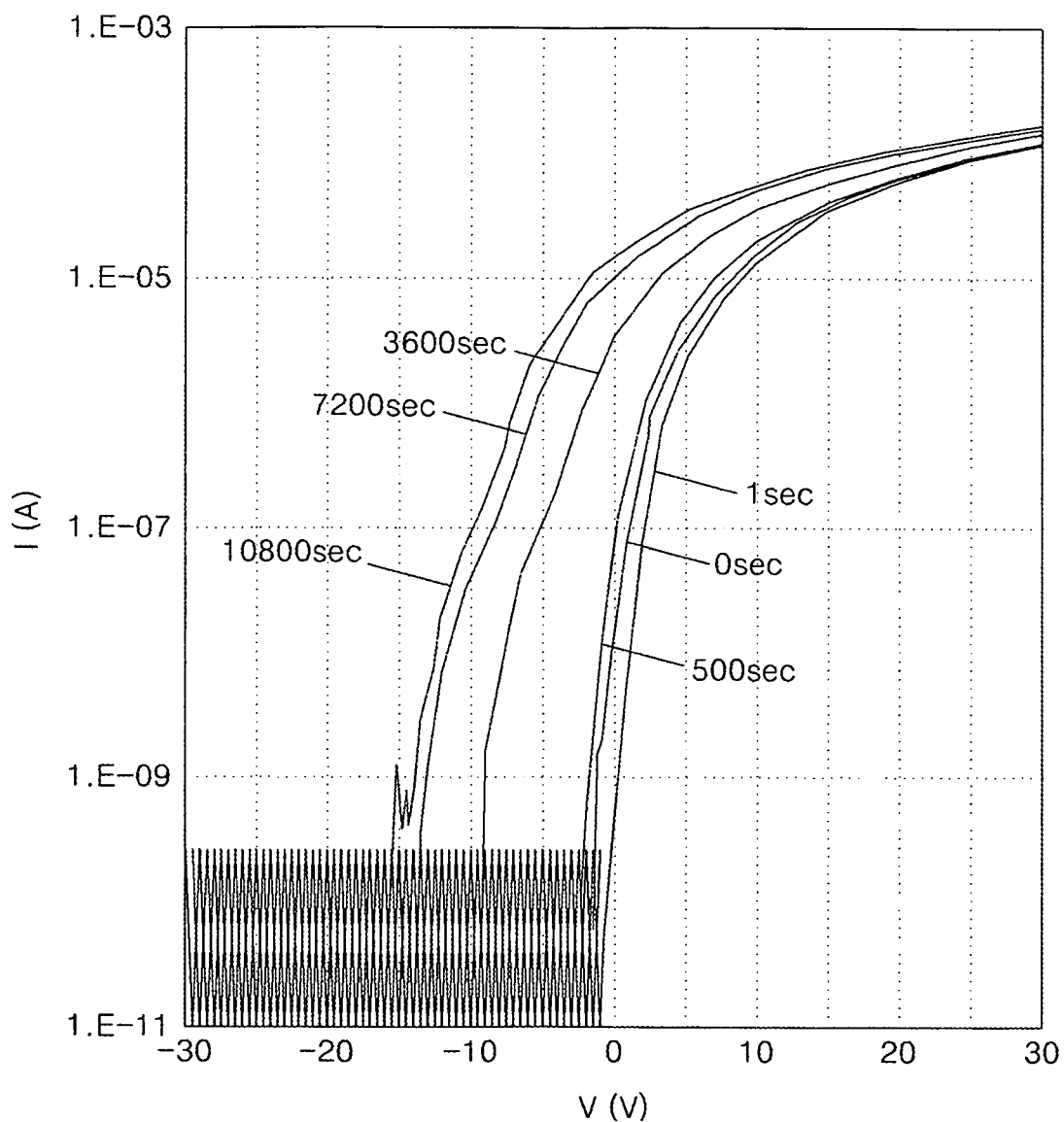
FIGS. 4A and 4B illustrate I-V characteristics of a conventional oxide semiconductor TFT having a single gate with respect to bias voltage application time periods.
Figure 4B:
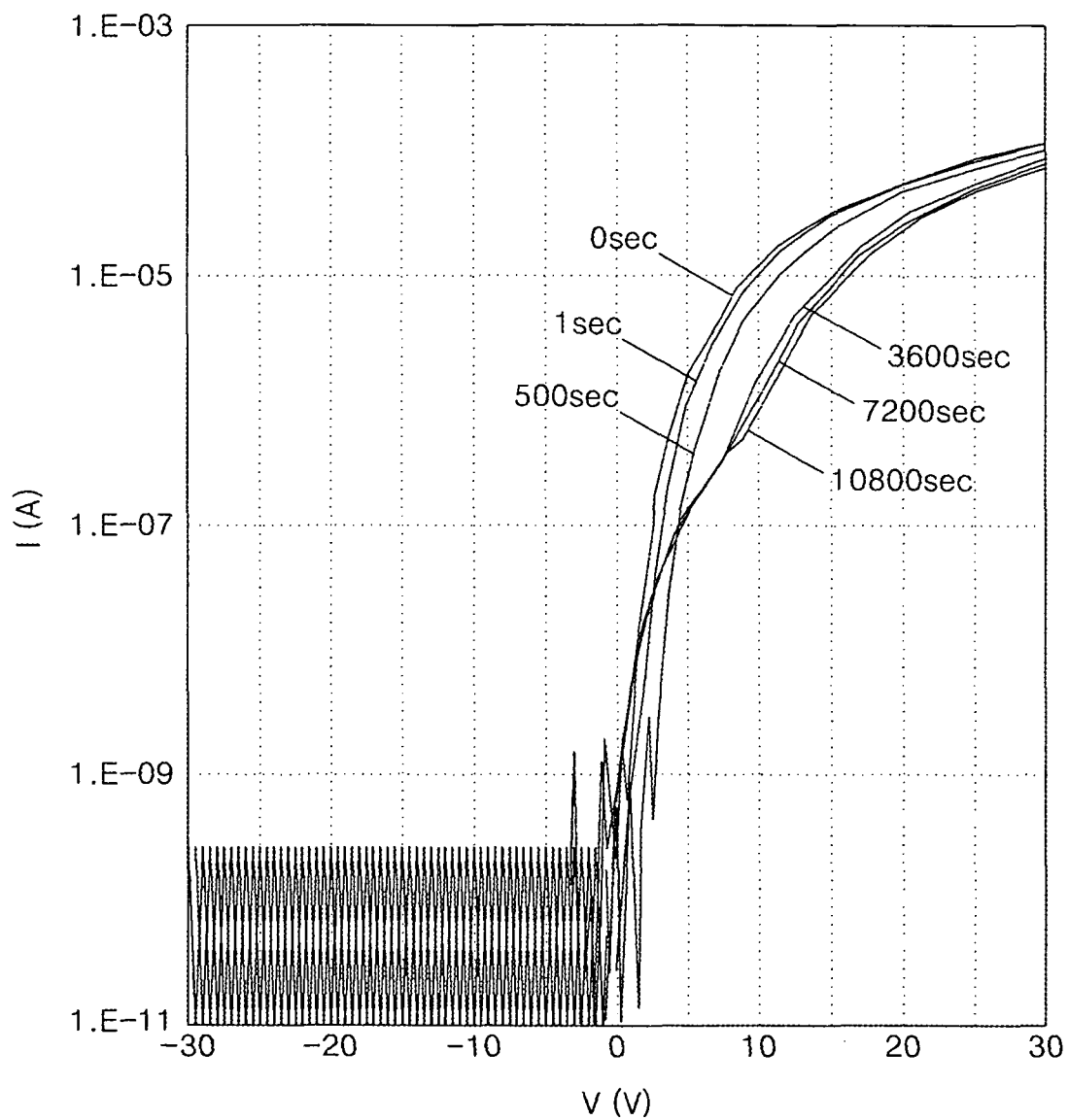

Turning now to FIGS. 4A and 4B, FIGS. 4A and 4B illustrate I-V characteristics of an oxide semiconductor TFT having a single gate structure with respect to bias voltage application time periods. Specifically, FIG. 4A illustrates the I-V characteristics of the oxide semiconductor TFT having the single gate structure with respect to an application time period for a negative bias voltage (DC −20V) that is applied between a gate and a source electrode at a temperature of 60° C. Also, FIG. 4B illustrates the I-V characteristics of the oxide semiconductor TFT having the single gate structure with respect to an application time period for a positive bias voltage (DC +20) that is applied between the gate and the source electrode at the temperature of 60° C. Here, the channel layer includes Ga—In—Zn Oxide as an oxide semiconductor. Also, first and second gate insulating layers are made out of silicon nitride and silicon oxide, respectively, and the gate, source, and drain electrodes are made out of Mo.

Referring to FIGS. 4A and 4B, in the oxide semiconductor TFT having the single gate structure, after the negative bias voltage has been applied for 3 hours, the threshold voltage decreases by about 9.7V. After the positive bias voltage has been applied for 3 hours, the threshold voltage is increased by 6.6V.

Figure 5A:
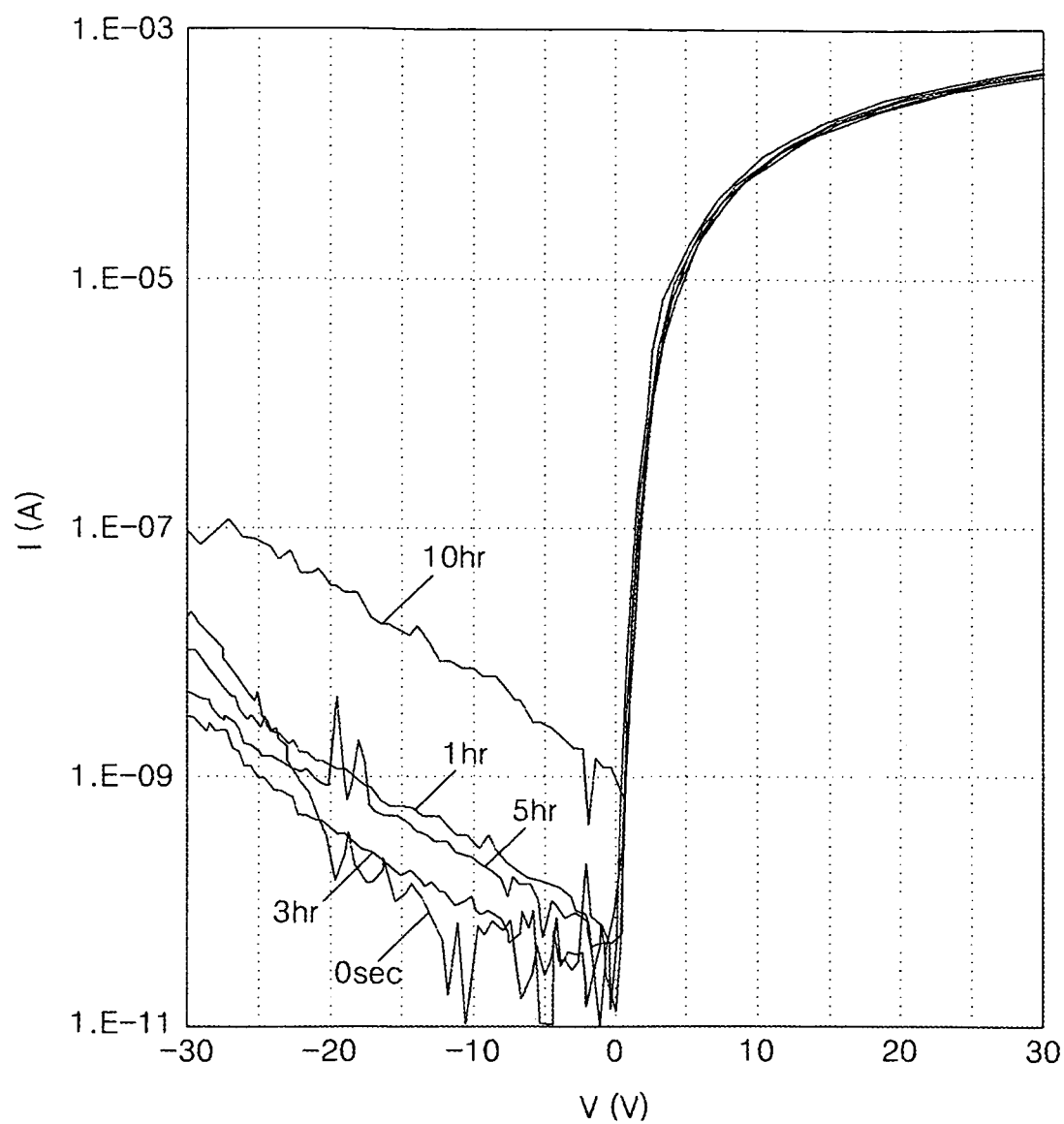
FIGS. 5A and 5B illustrate I-V characteristics of a double gate structure oxide semiconductor TFT with respect to bias voltage applying time periods, according to embodiments of the present invention.
Figure 5B:
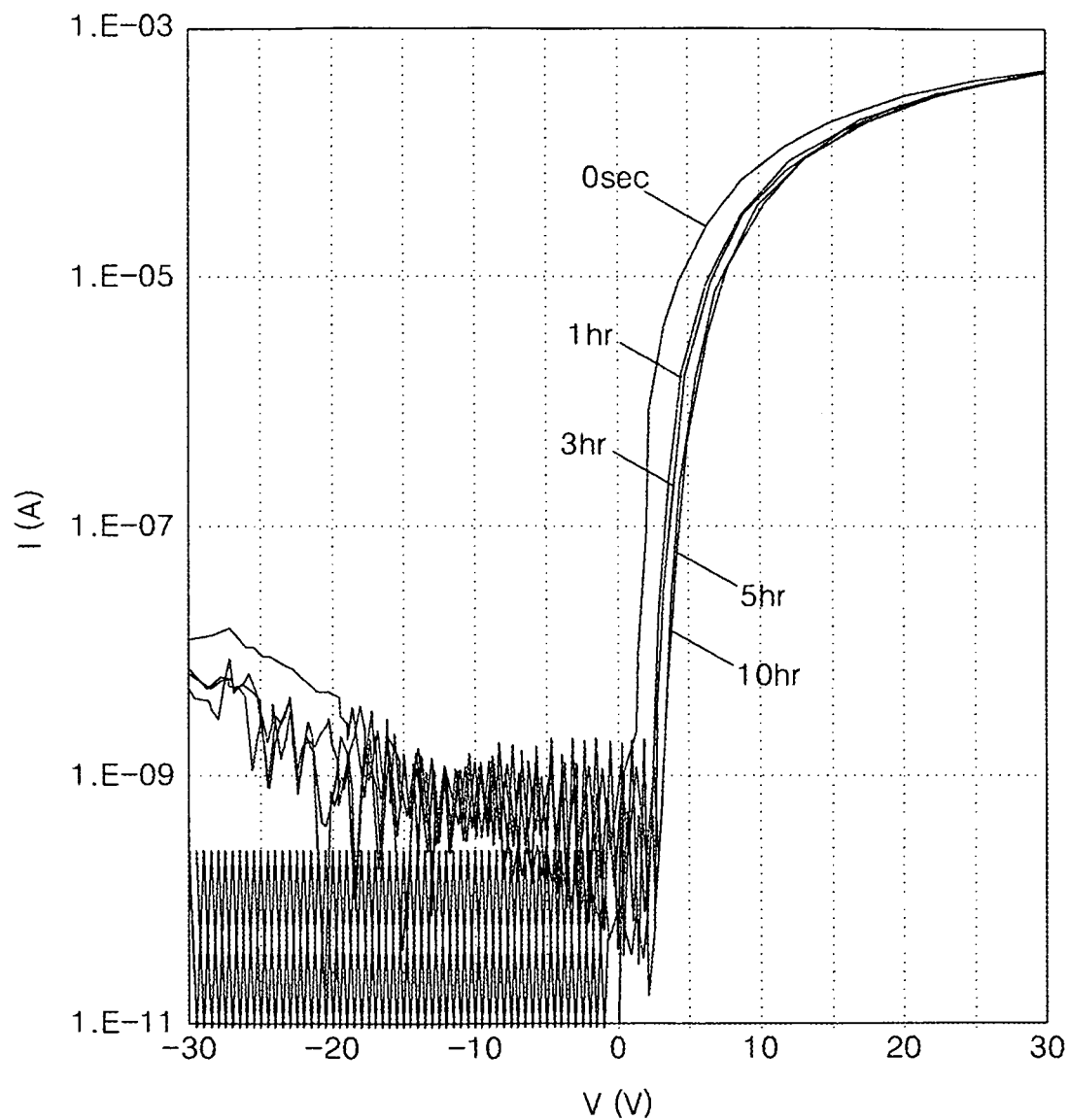

Turning now to FIGS. 5A and 5B, FIGS. 5A and 5B illustrate I-V characteristics of an oxide semiconductor TFT having first and second gates with respect to bias voltage application time periods, according to embodiments of the present invention. Here, the first gate is electrically connected to the second gate so that it is synchronized with the second gate. Specifically, FIG. 5A illustrates the I-V characteristics of the oxide semiconductor TFT with respect to an application time period for a negative bias voltage (DC −20V) that is applied between the first and second gates and the source electrode at a temperature of 60° C. Also, FIG. 5B illustrates the I-V characteristics of the oxide semiconductor TFT with respect to an application time period for a positive bias voltage (DC +20 C) that is applied between the first and second gates and the source electrode at the temperature of 60° C. Here, Ga—In Zn Oxide is used in the channel layer as an oxide semiconductor, and first and second gate insulating layers are made out of silicon nitride and silicon oxide, respectively. Also, thicknesses of the first and second gate insulating layers are about 4000 Å and about 2000 Å, respectively. The first gate, source, and drain electrodes are made out of Mo and are arranged on a lower surface of a channel layer, and the second gate is made out of In—Zn Oxide and is arranged on an upper surface of the channel layer.

Referring to FIGS. 5A and 5B, in the oxide semiconductor TFT having both first and second gates, after the negative bias voltage has been applied for 3 hours, a threshold voltage increases by about 0.2V. After the positive bias voltage has been applied for 3 hours, the threshold voltage increases by about 2.7V.

As described above, compared to the results for the single gate structure oxide semiconductor TFT of FIGS. 4A and 4B, in a double gate structure oxide semiconductor TFT, when the negative bias voltage is applied, the variation in a threshold voltage is greatly reduced from 9.7V to 0.2V. When a positive bias voltage is applied, the variation in the threshold voltage is greatly reduced from 6.6V to 2.7V. Therefore, electrical reliability for the double gate structure oxide semiconductor TFT is improved significantly over that of the single gate structure oxide semiconductor TFT. The improvement of the electric reliability of the double gate structure oxide semiconductor TFT is attributed to the following reasons. A voltage is simultaneously applied to the first and the second gates to disperse carriers in an active layer. Also, an electric field produced by the first gate overlaps with an electric field produced by the second gate to weaken the total electric field. In addition, silicon oxide within the second gate insulating layer causes the threshold voltage to increase, while silicon nitride within the first gate insulating layer causes the threshold voltage to decrease.

Figure 6:
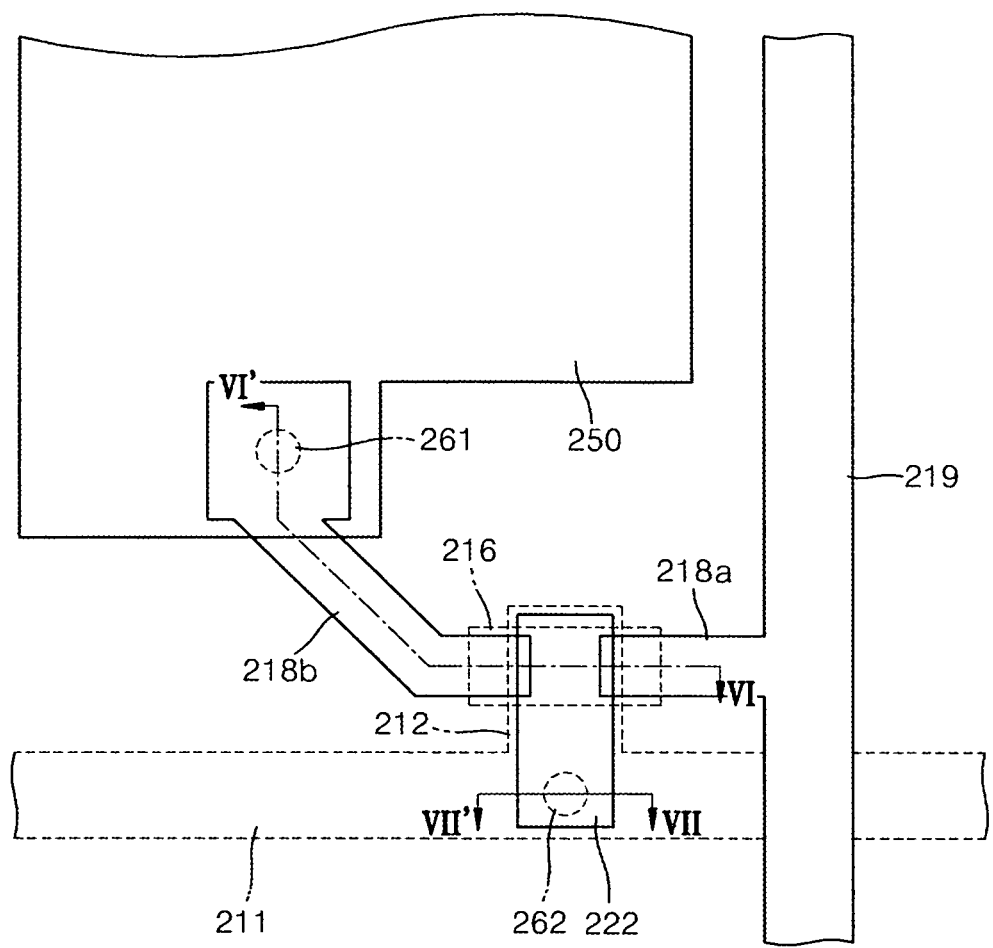
FIG. 6 is a plan view of an oxide semiconductor TFT applied to a pixel unit of a display device according to another embodiment of the present invention.
Figure 7:
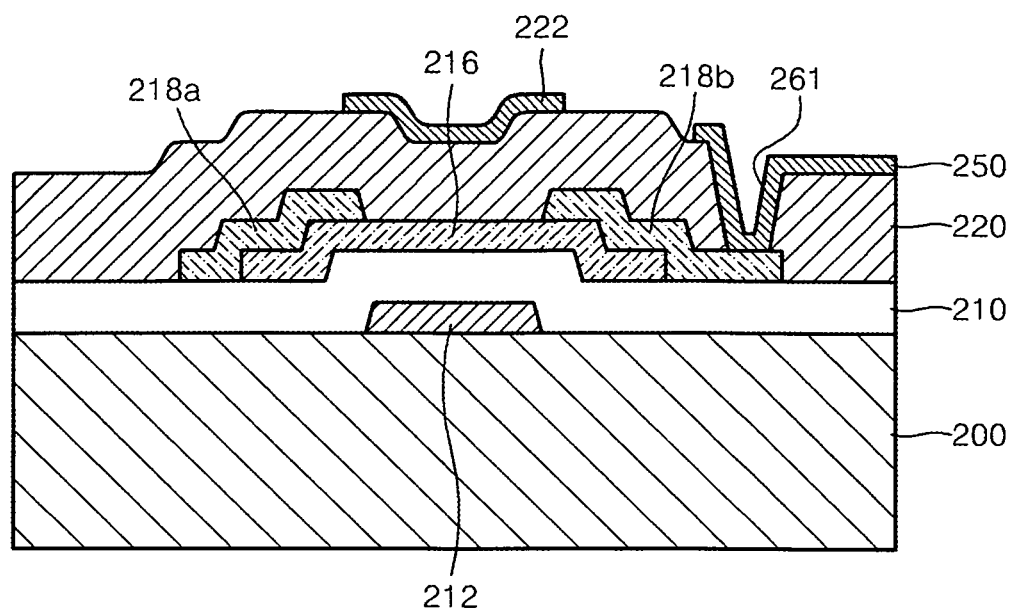
FIG. 7 is a cross-sectional view taken along line VI-VI' of FIG. 6.
Figure 8:
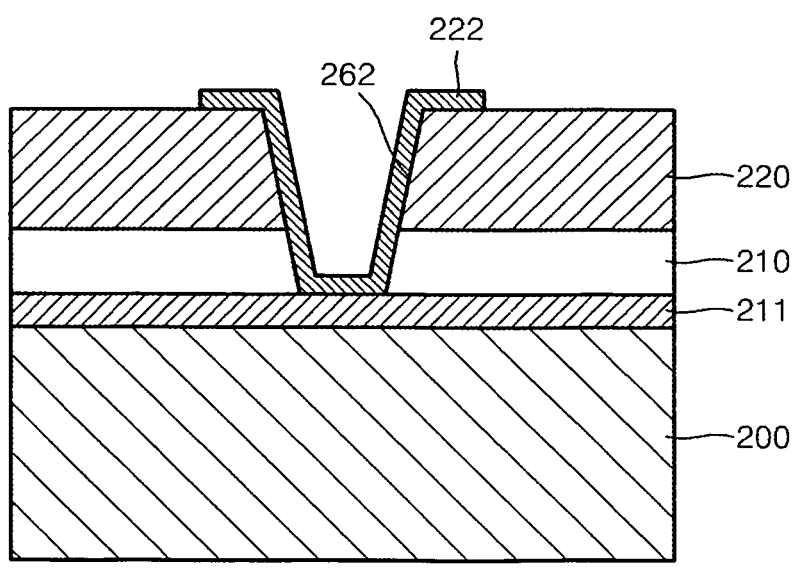
FIG. 8 is a cross-sectional view taken along line VII-VII' of FIG. 6.

The oxide semiconductor TFT of the above embodiment of the present invention as described above can be applied to a driving circuit unit and a pixel unit of a display device. Turning now to FIGS. 6 through 8, FIG. 6 is a plan view of an oxide semiconductor TFT applied to a pixel unit of a display device according to another embodiment of the present invention, FIG. 7 is a cross-sectional view taken along line VI-VI' of FIG. 6, and FIG. 8 is a cross-sectional view taken along line VII-VII' of FIG. 6. Hereinafter, the features of the oxide semiconductor TFT of the present embodiment that are different from the oxide semiconductor TFT of the previous embodiment will be emphasized in the following description.

Referring now to FIGS. 6 through 8, a first gate 212 and a gate line 211 are formed on substrate 200. The gate line 211 is electrically connected to the first gate 212 so that a predetermined voltage can be applied to the first gate 212. A first gate insulating layer 210 is formed on the substrate 200 to cover the first gate 212 and the gate line 211. The first gate insulating layer 210 can be made out of a material that does not include oxygen, such as silicon nitride. A thickness of the first gate insulating layer 210 can be different from that of a second gate insulating layer 220. Specifically, a thickness $d_1$ of the first gate insulating layer 210 can be thicker than a thickness $d_2$ of the second gate insulating layer 220.

A channel layer 216 made out of an oxide semiconductor having a predetermined thickness is arranged on the first gate insulating layer 210 at a location that corresponds to the first gate 212. The oxide semiconductor can be Zinc Oxide, Tin Oxide, Ga—In—Zn Oxide, In—Zn Oxide, In—Sn Oxide, or one of Zinc Oxide, Tin Oxide, Ga—In—Zn Oxide, In—Zn Oxide, and In—Sn Oxide that are doped with at one of Al, Ni, Cu, Ta, Mo, Hf, or Ti. The channel layer 216 can have a thickness between 10 nm and and 300 nm.

A source electrode 218*a* and a drain electrode 218*b* are respectively formed on opposite sides of an upper surface of the oxide semiconductor channel layer 216. The source electrode 218*a* is electrically connected to a data line 219. The second gate insulating layer 220 having a predetermined thickness is arranged on the first gate insulating layer 210 to cover the channel layer 216 and the source and drain electrodes 218*a* and 218*b*. Here, the second gate insulating layer 220 can be made out of a material that includes oxygen, such as silicon oxide. The second gate insulating layer 220 has a thickness that is different from that of the first gate insulating layer 210. In detail, the thickness $d_2$ of the second gate insulating layer 220 can be thinner than the thickness $d_1$ of the first gate insulating layer 210.

A second gate 222 is formed on the second gate insulating layer 220 at a location that corresponds to the channel layer 216. The second gate 222 can be formed to have a line width between 0.08 µm and 100 µm. As previously discussed, if a predetermined voltage is applied to the second gate 222, the second gate 222 reduces leakage current and increases an operating current in a turn-on state of the oxide semiconductor TFT.

A pixel electrode 250 is formed on the second gate insulating layer 220 and is electrically connected to the drain electrode 218*b*. To accomplish this, as shown in FIG. 7, a first via hole 261 is formed in a portion of the second gate insulating layer 220 that corresponds to the drain electrode 218*b* to expose a portion of the drain electrode 218*b*. Also, the pixel electrode 250 is electrically connected to the drain electrode 218*b* through the first via hole 261. The pixel electrode 250 can be made out of a transparent conductive material such as Indium Tin Oxide (ITO) or Indium Zinc Oxide (IZO). The pixel electrode 250 and the second gate 222 can be simultaneously formed on the second gate insulating layer 220. When formed simultaneously, the second gate 222 can be made out of the same material as the pixel electrode 250.

As shown in FIG. 8, the second gate 222 is formed to be electrically connected to the gate line 211. To accomplish this, a second via hole 262 is formed in the first and second gate insulating layers 210 and 220 that are arranged on the gate line 211 to expose a portion of the gate line 211. Also, the second gate 222 is electrically connected to the gate line 211 through the second via hole 262. Therefore, the second gate 222 can be electrically connected to the first gate 212 so that the second gate 222 can be electrically synchronized to the first gate 212.

It has been described in FIGS. 6 through 8 of the present embodiment that the second gate 222 is electrically connected to the first gate 212. However, the second gate 222 can instead be connected to an independent line (not shown) that is not electrically connected to the first gate 212. In this alternate scenario, the independent line can be formed on the substrate 200 or on another material layer. When the second gate 222 is electrically insulated from the first gate 212, a predetermined direct current (DC) voltage is applied to the second gate 222 through the independent line separate from the first gate 212.

Figure 9:
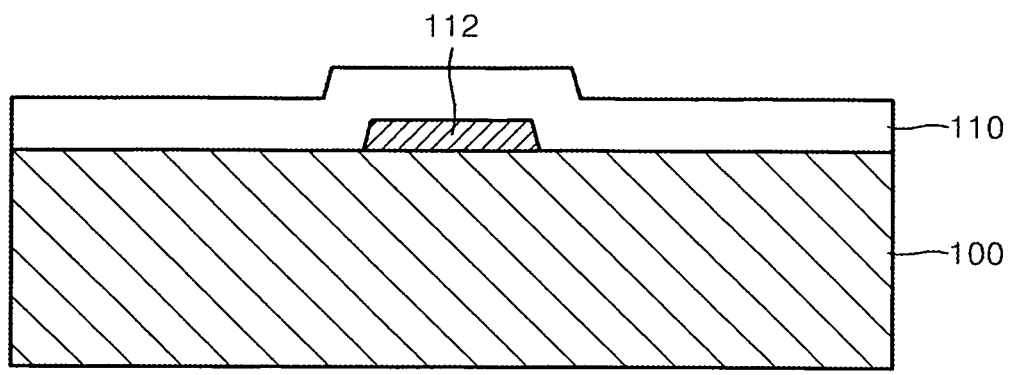
FIGS. 9 through 11 are cross-sectional views illustrating a method of manufacturing an oxide semiconductor TFT according to an embodiment of the present invention.
Figure 10:
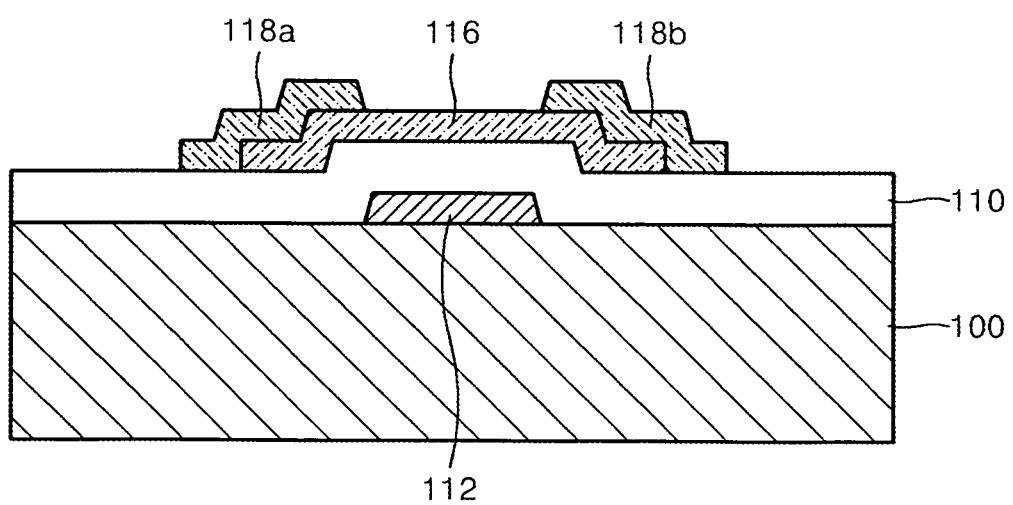
Figure 11:
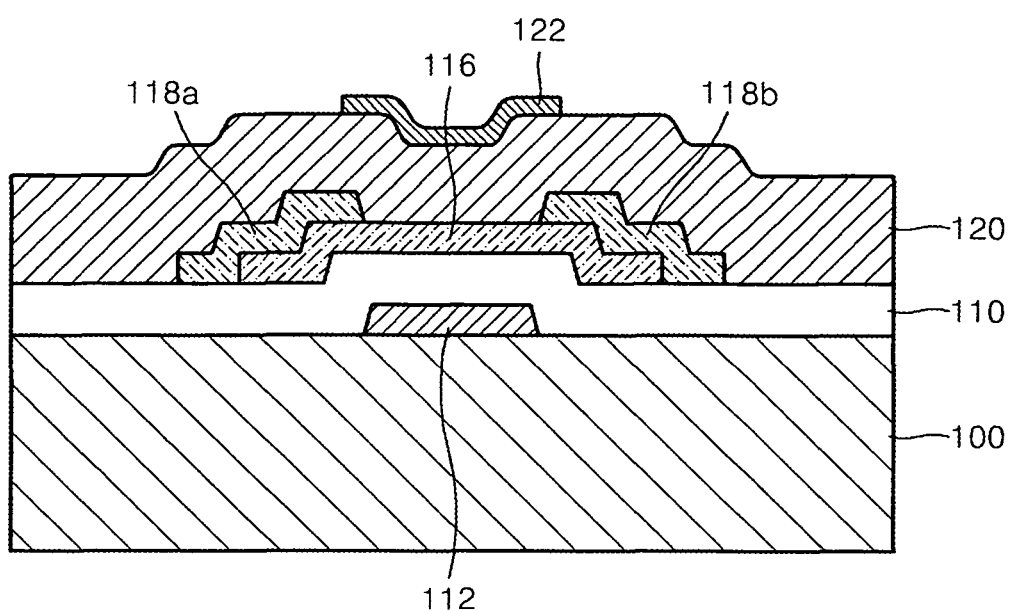

A method of manufacturing an oxide semiconductor TFT according to an embodiment of the present invention will now be described. Turning now to FIGS. 9 through 11, FIGS. 9 through 11 are cross-sectional views illustrating a method of manufacturing the oxide semiconductor TFT having the double gate structure according to an embodiment of the present invention.

Referring to FIG. 9, the first gate 112 is formed on the substrate 100. Here, a predetermined gate metal can be deposited on the substrate 100 and then patterned to form the first gate 112. In this process, the gate line 211 of FIG. 6 can be formed on the substrate 100 together with the first gate 112 so that gate line 211 is electrically connected to the first gate 112. The first gate insulating layer 110 is then formed on the substrate 100 to cover the first gate 112. Here, the first gate insulating layer 110 can be made out of a material that does not include oxygen, such as silicon nitride. Also, the first gate insulating layer 110 can be made to have a greater thickness than that of the second gate insulating layer 120. Specifically, the thickness $d_1$ of the first gate insulating layer 110 can be from 2000 Å to 1 μm, but the present invention is not limited thereto.

Referring now to FIG. 10, the channel layer 116 made out of an oxide semiconductor is formed on the first gate insulating layer 110 at a location that corresponds to the first gate 112. The oxide semiconductor can be deposited to a predetermined thickness on the first gate insulating layer 110 and then patterned to form the channel layer 116. The oxide semiconductor can be Zinc Oxide, Tin Oxide, Ga—In—Zn Oxide, In—Zn Oxide, In—Sn Oxide, or one of Zinc Oxide, Tin Oxide, Ga—In—Zn Oxide, In—Zn Oxide, and In—Sn Oxide that are doped with at least one of Al, Ni, Cu, Ta, Mo, Hf and Ti. The channel layer 116 can be formed to have a thickness between 10 nm and 300 nm, but the present invention is not limited thereto. The source and drain electrodes 118a and 118b are formed on the opposite sides of the upper surface of the oxide semiconductor channel layer 116. To form the source and drain electrodes 118a and 118b, a predetermined metal layer is formed on the first gate insulating layer 110 to cover the channel layer 116. This metal layer is then patterned to produce the source and drain electrodes 118a and 118b. Here, the predetermined metal layer can be a single layer structure or a multilayer structure. The predetermined metal layer can also be made out of at least one of Cu, Mo, and Al. After the source and drain electrodes 118a and 118b are formed, a plasma process containing oxygen ions can then be performed on the resultant structure of FIG. 10 to supply oxygen into an exposed portion of the upper surface of the channel layer 116 between the source and drain electrodes 118a and 118b. Up until now, only the embodiment of where the channel layer 116 is arranged beneath the source and drain electrodes 118a and 118b has been described, however the channel layer 116 can instead be arranged on top of the source and drain electrodes 118a and 118b after the source and drain electrodes 118a and 118b have been formed.

Referring now to FIG. 11, the second gate insulating layer 120 is formed on the first gate insulating layer 110 to cover the channel layer 116 and the source and drain electrodes 118a and 118b. Here, the second gate insulating layer 120 can be made out of a different material from that of the first gate insulating layer 110. More specifically, the second gate insulating layer 120 can be made out of a material that includes oxygen, such as silicon oxide. The second gate insulating layer 120 can have a smaller thickness than that of the first gate insulating layer 110. More specifically, the thickness $d_2$ of the second gate insulating layer 120 can be between 500 Å and 5000 Å, but the present invention is not limited thereto. The second gate 122 is formed on the second gate insulating layer 120 at a location that corresponds to the channel layer 116. To produce second gate 122, a predetermined gate metal is deposited on the second gate insulating layer 120 and this gate metal is then patterned to form the second gate 122. Here, the second gate 122 can have a line width between 0.08 μm and 100 μm.

Although not shown in FIGS. 9 through 11, in the embodiment of where the second gate 122 is electrically connected to the gate line. the first and second gate insulating layers 110 and 120 positioned above the gate line can be etched to form a via hole so as to expose a portion of the gate line. Next, the second gate 122 can be formed on an inner wall of the via hole and on the second gate insulating layer 120. In contrast, when the second gate 122 is electrically connected to an independent line that is not connected to the first gate 112, a via hole can be formed in a material layer arranged on top of an independent line to expose a portion of the independent line.

Then, the second gate 122 can be formed on an inner wall of this via hole and on the second gate insulating layer 120. Here, the independent line can be formed on the substrate 100 or on another material layer.

If a pixel electrode is to be further formed on the second gate insulating layer 120, the pixel electrode and the second gate 122 can be formed simultaneously. More specifically, a via hole is formed in a portion of the second gate insulating layer 120 at a location that corresponds to the drain electrode 118b to expose a portion of the drain electrode 118b. A predetermined material is then deposited to cover the second gate insulating layer 120 and the via hole and then patterned so as to form the second gate 122 and the pixel electrode. Therefore, the second gate 122 can be formed on a portion of the second gate insulating layer 120 that corresponds to the channel layer 116, and the pixel electrode can be formed on an inner wall of the via hole and on the second gate insulating layer 120. Here, the second gate 122 and the pixel electrode can both be made out of a transparent conductive material such as ITO or IZO.

An oxide semiconductor TFT having a Bottom Gate Back Channel Etch (BCE) structure has been described in the above embodiments. However, this is only one example of the present invention, and thus the above described embodiments of the present invention can also be applied to oxide semiconductor TFTs having other types of structures, such as a Bottom Gate Etch Stop structure, a Top Gate structure, etc and still be within the scope of the present invention. More specifically, in the oxide semiconductor TFT having the Bottom Gate Etch Stop structure, an etch stop layer is formed on a portion of an upper surface of a channel layer that is between source and drain electrodes. In the oxide semiconductor TFT having the Top Gate structure, a first gate and a first gate insulating layer are located above the channel layer, and a second gate and a second gate insulating layer are located underneath the channel layer.

It Should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. An oxide semiconductor thin film transistor (TFT), comprising:
   a channel layer including an oxide semiconductor;
   a first gate;
   a second gate, the second gate electrically connected to the first gate;
   a first gate insulating layer arranged between the channel layer and the first gate; and
   a second gate insulating layer arranged between the channel layer and the second gate, wherein the first and second gate insulating layers are comprised of different materials.

2. The oxide semiconductor TFT of claim 1, wherein the first gate insulating layer is comprised of a material that is absent of oxygen, and the second gate insulating layer is comprised a material that includes oxygen.

3. The oxide semiconductor TFT of claim 2, wherein the first gate insulating layer is comprised of silicon nitride, and the second gate insulating layer is comprised of silicon oxide.

4. The oxide semiconductor TFT of claim 2, wherein the first and second gate insulating layers have different thicknesses.

5. The oxide semiconductor TFT of claim 4, wherein the first gate insulating layer is thicker than the second gate insulating layer.

6. The oxide semiconductor TFT of claim 5, wherein a thickness of the first gate insulating layer is in the range of 2000 Å to 1 μm, and a thickness of the second gate insulating layer is in the range of 500 Å to 5000 Å.

7. The oxide semiconductor TFT of claim 1, further comprising source and drain electrodes arranged at opposite sides of an upper surface of the channel layer.

8. The oxide semiconductor TFT of claim 1, further comprising source and drain electrodes arranged at opposite sides of a lower surface of the channel layer.

9. The oxide semiconductor TFT of claim 1, wherein the oxide semiconductor is a material selected from a group consisting of Zinc Oxide, Tin Oxide, Ga—In—Zn Oxide, In—Zn Oxide, In—Sn Oxide, and one of Zinc Oxide, Tin Oxide, Ga—In—Zn Oxide, In—Zn Oxide, and In—Sn Oxide that are doped with one of Al, Ni, Cu, Ta, Mo, Hf, and Ti.

10. An oxide semiconductor TFT, comprising:
    a channel layer including an oxide semiconductor;
    a first gate;
    a second gate, the second gate electrically connected to the first gate,
    a first gate insulating layer arranged between the channel layer and the first gate; and
    a second gate insulating layer arranged between the channel layer and the second gate, wherein the first and second gate insulating layers have different thicknesses.

11. The oxide semiconductor TFT of claim 10, wherein the first gate insulating layer is thicker than the second gate insulating layer.

12. The oxide semiconductor TFT of claim 11, wherein a thickness of the first gate insulating layer is in the range of 2000 Å to 1 μm, and a thickness of the second gate insulating layer is in the range of 500 Å to 5000 Å.

13. The oxide semiconductor TFT of claim 11, wherein the first and second gate insulating layers are comprised of different materials.

14. The oxide semiconductor TFT of claim 13, wherein the first gate insulating layer is comprised of a material that is absent of oxygen, and the second gate insulating layer is comprised of a material that includes oxygen.

15. The oxide semiconductor TFT of claim 14, wherein the first gate insulating layer is comprised of silicon nitride, and the second gate insulating layer is comprised of silicon oxide.

16. The oxide semiconductor TFT of claim 10, further comprising source and drain electrodes arranged at opposite sides of an upper surface of the channel layer.

17. The oxide semiconductor TFT of claim 10, further comprising source and drain electrodes arranged at opposite sides of a lower surface of the channel layer.

18. The oxide semiconductor of claim 10, wherein the oxide semiconductor is a material selected from a group consisting of Zinc Oxide, Tin Oxide, Ga—In—Zn Oxide, In—Zn Oxide, In—Sn Oxide, and one of Zinc Oxide, Tin Oxide, Ga—In—Zn Oxide, In—Zn Oxide, and In—Sn Oxide that are is doped with one of Al, Ni, Cu, Ta, Mo, Hf, and Ti.

19. A method of manufacturing an oxide semiconductor TFT, comprising:
    forming sequentially a first gate and a first gate insulating layer on a substrate;
    forming a channel layer comprised of an oxide semiconductor on the first gate insulating layer;
    forming a second gate insulating layer that covers the channel layer; and
    forming a second gate on the second gate insulating layer, the second gate electrically connected to the first gate.

20. The method of claim 19, wherein the first and second gate insulating layers are comprised of different materials.

21. The method of claim 20, wherein the first gate insulating layer is comprised of a material that is absent of any oxygen, and the second gate insulating layer is comprised of a material that includes oxygen.

22. The method of claim 21, wherein the first gate insulating layer is comprised of silicon nitride, and the second gate insulating layer is comprised of silicon oxide.

23. The method of claim 21, wherein the first and second gate insulating layers have different thicknesses.

24. The method of claim 23, wherein the first gate insulating layer is thicker than the second gate insulating layer.

25. The method of claim 24 wherein the first gate insulating layer has a thickness in the range of 2000 Å to 1 μm, and the second gate insulating layer has a thickness in the range of 500 Å to 5000 Å.

26. The method of claim 19, further comprising forming source and drain electrodes at opposite sides of an upper surface of the channel layer after the formation of the channel layer.

27. The method of claim 19, further comprising forming source and drain electrodes on the first gate insulating layer before the formation of the channel layer.

28. The method of claim 19, further comprising supplying oxygen into an upper portion of the channel layer by performing a plasma process that includes oxygen ions.

29. The method of claim 19, wherein the oxide semiconductor is comprised of a material selected from a group consisting of Zinc Oxide, Tin Oxide, Ga—In—Zn Oxide, In—Zn Oxide, In—Sn Oxide, and one of Zinc Oxide, Tin Oxide, Ga—In—Zn Oxide, In—Zn Oxide and In—Sn Oxide that are doped with one of Al, Ni, Cu, Ta, Mo, Hf, and Ti.

* * * * *